(12) United States Patent
Shannon et al.

(10) Patent No.: US 7,510,665 B2
(45) Date of Patent: *Mar. 31, 2009

(54) PLASMA GENERATION AND CONTROL USING DUAL FREQUENCY RF SIGNALS

(75) Inventors: Steven C. Shannon, San Mateo, CA (US); Alexander Paterson, San Jose, CA (US); Theodoros Panagopoulos, San Jose, CA (US); John P. Holland, San Jose, CA (US); Dennis S. Grimard, Ann Arbor, MI (US); Daniel J. Hoffman, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 219 days.

This patent is subject to a terminal disclaimer.

(21) Appl. No.: 11/416,468

(22) Filed: May 2, 2006

(65) Prior Publication Data
US 2006/0266735 A1    Nov. 30, 2006

Related U.S. Application Data

(63) Continuation-in-part of application No. 10/843,914, filed on May 12, 2004, now Pat. No. 7,431,857.

(60) Provisional application No. 60/679,042, filed on May 9, 2005, provisional application No. 60/495,523, filed on Aug. 15, 2003.

(51) Int. Cl.
*G01R 31/00* (2006.01)
(52) U.S. Cl. .............. 216/59; 216/61; 216/67; 438/706; 438/710; 438/714
(58) Field of Classification Search .......... 216/59, 216/61, 67; 438/706, 710, 714
See application file for complete search history.

(56) References Cited
U.S. PATENT DOCUMENTS
4,579,618 A    4/1986    Celestino et al.

(Continued)

FOREIGN PATENT DOCUMENTS
EP    0 553 704 A1    8/1993

(Continued)

OTHER PUBLICATIONS

Georgieva, V., et al., "Numerical study of $Ar/CF_4/N_2$ discharges in single- and dual-frequency capacitively coupled plasma reactors", *Journal of Applied Physics*, vol. 94, No. 6 (Sep. 15, 2003), 3748-3756.

(Continued)

*Primary Examiner*—Shamim Ahmed
(74) *Attorney, Agent, or Firm*—Moser IP Law Group

(57) ABSTRACT

A method for controlling a plasma in a semiconductor substrate processing chamber is provided. The method includes the steps of supplying a first RF signal to a first electrode within the processing chamber at a first frequency selected to cause plasma sheath oscillation at the first frequency; and supplying a second RF signal from the source to the first electrode at a second frequency selected to cause plasma sheath oscillation at the second frequency, wherein the second frequency is different from the first frequency by a differential equal to a desired frequency selected to cause plasma sheath oscillation at the desired frequency.

19 Claims, 5 Drawing Sheets

U.S. PATENT DOCUMENTS

| | | |
|---|---|---|
| 4,585,516 A | 4/1986 | Corn et al. |
| 4,863,549 A | 9/1989 | Grunwald |
| 5,065,118 A | 11/1991 | Collins et al. |
| 5,077,499 A | 12/1991 | Oku |
| 5,512,130 A | 4/1996 | Barna et al. |
| 5,534,751 A | 7/1996 | Lenz et al. |
| 5,556,501 A | 9/1996 | Collins et al. |
| 5,570,031 A | 10/1996 | Sasaki et al. |
| 5,643,364 A | 7/1997 | Zhao et al. |
| 5,698,062 A | 12/1997 | Sakamoto et al. |
| 5,817,534 A | 10/1998 | Ye et al. |
| 5,985,375 A | 11/1999 | Donohoe et al. |
| 6,089,181 A | 7/2000 | Suemasa et al. |
| 6,110,287 A | 8/2000 | Arai et al. |
| 6,113,731 A | 9/2000 | Shan et al. |
| 6,126,778 A | 10/2000 | Donohoe et al. |
| 6,190,496 B1 | 2/2001 | DeOrnellas et al. |
| 6,193,855 B1 | 2/2001 | Gopalraja et al. |
| 6,309,978 B1 | 10/2001 | Donohoe et al. |
| 6,312,556 B1 | 11/2001 | Donohoe et al. |
| 6,354,240 B1 | 3/2002 | DeOrnellas et al. |
| 6,411,490 B2 | 6/2002 | Dible |
| 6,642,149 B2 | 11/2003 | Suemasa et al. |
| 2002/0039626 A1 | 4/2002 | Nakahigashi et al. |
| 2002/0041160 A1 | 4/2002 | Barnes et al. |
| 2002/0108933 A1 | 8/2002 | Hoffman et al. |
| 2003/0127319 A1 | 7/2003 | Demaray et al. |
| 2003/0148611 A1 | 8/2003 | Dhindsa et al. |
| 2004/0045669 A1 | 3/2004 | Okumura et al. |
| 2005/0034816 A1 | 2/2005 | Shannon et al. |
| 2005/0090118 A1 | 4/2005 | Shannon et al. |
| 2005/0241762 A1 | 11/2005 | Paterson et al. |

FOREIGN PATENT DOCUMENTS

| | | |
|---|---|---|
| JP | 10326698 A | 12/1998 |
| JP | 2002-246368 A | 8/2002 |
| JP | 2003-073836 | 3/2003 |
| WO | WO 03/43061 A1 | 5/2003 |

OTHER PUBLICATIONS

Lieberman, M. A., et al., "Standing wave and skin effects in large-area, high-frequency capacitive discharges", *Plasma Sources Sci. Technol.*, 11 (2002), 283-293.

PLASMA GENERATION AND CONTROL USING DUAL FREQUENCY RF SIGNALS

CROSS-REFERENCE TO RELATED APPLICATIONS

This application is a continuation in part of U.S. patent application Ser. No. 10/843,914, filed May 12, 2004, U.S. Pat. No. 7,431,857, which claims the benefit of U.S. Provisional Patent Application Ser. No. 60/495,523 filed Aug. 15, 2003. This application also claims benefit of U.S. Provisional Patent Application Ser. No. 60/679,042, filed May 9, 2005. Each of the aforementioned patent applications are hereby incorporated by reference.

BACKGROUND OF THE INVENTION

1. Field of the Invention

The present invention generally relates to semiconductor substrate processing systems and, more particularly, to plasma generation and control using a dual frequency RF source.

2. Description of the Related Art

Plasma enhanced semiconductor processing chambers are widely used to manufacture integrated circuit devices. In most plasma enhanced chambers, multiple radio frequency (RF) sources are utilized to form and control the plasma. For example, an RF source with a high frequency is typically used for plasma formation and ion dissociation. Additionally, an RF source with a lower frequency is often used to modulate the plasma sheath in order to control the accumulation of a DC voltage (i.e., bias voltage) on the substrate. The cost of the various sources and their related matching circuits are quite substantial and contribute to the high cost of the equipment needed to fabricate integrated circuits. Reducing the RF infrastructure without sacrificing any process benefit would result in significant cost savings.

Therefore, there is a need for an improved method and apparatus for plasma generation and control in a plasma enhanced semiconductor substrate processing.

SUMMARY OF THE INVENTION

A method for controlling a plasma in a semiconductor substrate processing chamber is provided. The method includes the steps of supplying a first RF signal to a first electrode within the processing chamber at a first frequency selected to cause plasma sheath oscillation at the first frequency; and supplying a second RF signal from the source to the first electrode at a second frequency selected to cause plasma sheath oscillation at the second frequency, wherein the second frequency is different from the first frequency by a differential equal to a desired frequency selected to cause plasma sheath oscillation at the desired frequency.

In another embodiment, a method for controlling a plasma in a plasma enhanced semiconductor substrate processing chamber includes the steps of supplying, to a first electrode within the processing chamber, a first and a second RF signal at a first and a second frequency, respectively, selected to selected to cause a response much faster than a transit time for an ion to traverse a sheath of the plasma when accelerated from a bulk of the plasma; and controlling a frequency differential between the first and the second frequencies equal to a desired frequency selected to control an ion energy distribution within the plasma.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The present invention is a method and apparatus for forming and controlling characteristics of a plasma in a plasma enhanced semiconductor processing chamber using a dual frequency RF source. Plasma enhanced semiconductor processing chambers generally utilize power fed at two frequencies: a high frequency for plasma excitation and ion dissociation; and a low frequency for plasma sheath modulation. In one embodiment, the present invention utilizes two high frequency inputs generated from a single RF source to generate the plasma. One or more characteristics of the plasma, for example, the sheath modulation, is controlled by utilization of a wave packet phenomenon that creates a low frequency component in the plasma sheath equivalent to the difference in frequency between the two input signals.

Figure 1:
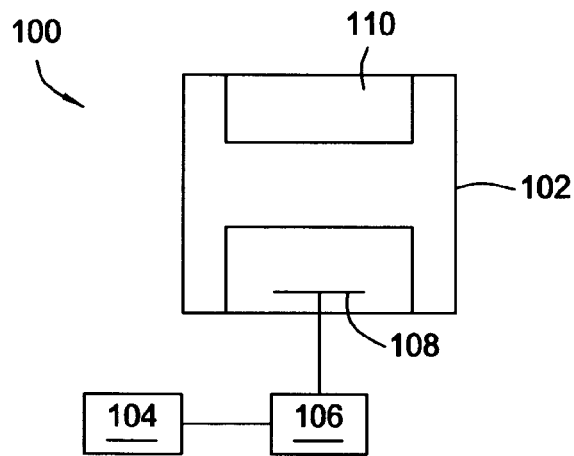
FIG. 1 depicts an exemplary block diagram of a plasma enhanced semiconductor processing chamber having a dual frequency RF source.

FIG. 1 depicts a simplified block diagram of a plasma enhanced semiconductor processing chamber having a dual frequency RF source. A plasma enhanced processing chamber 100 according to the present invention includes a chamber 102, a dual frequency RF power source 104, and a single matching circuit 106. The chamber 102 includes a powered electrode 108 that is coupled to the source 104 through the matching circuit 106 and a grounded electrode 110. The chamber 102 is otherwise similar to a conventional plasma enhanced processing chamber with the exception of the reduced RF infrastructure.

The source 104 is an RF generator with dual frequency excitation. The source 104 is generally capable of generating two frequencies in the range of from about 100 KHz to about 200 MHz. The source 104 is also generally able to produce up to 5000 W of either continuous or pulsed power. In one specific embodiment, the source produces both about 13 MHz and about 14 MHz, each frequency at about 3 KW.

Figure 2:
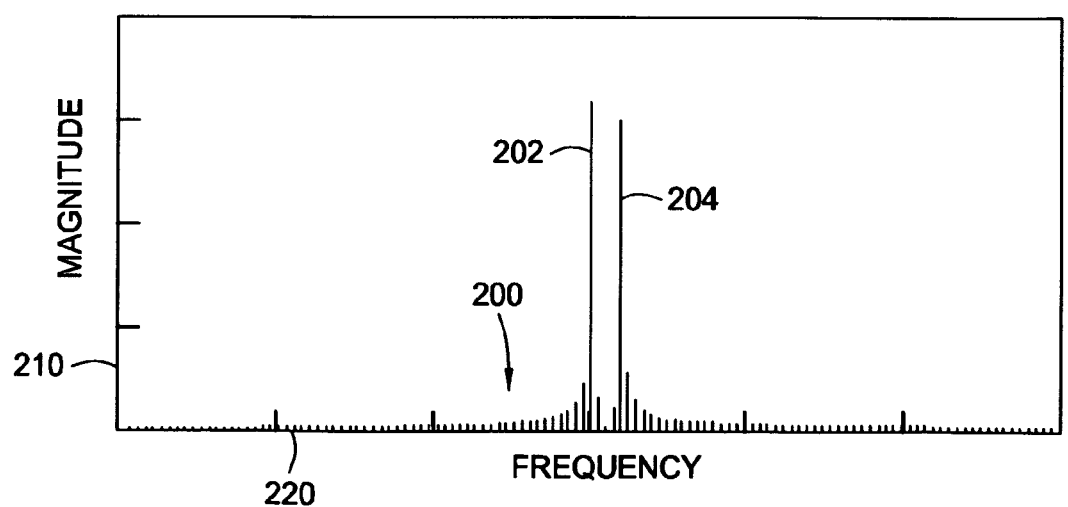
FIG. 2 is a graph of the frequency spectrum of an input waveform on the electrode.
Figure 3:
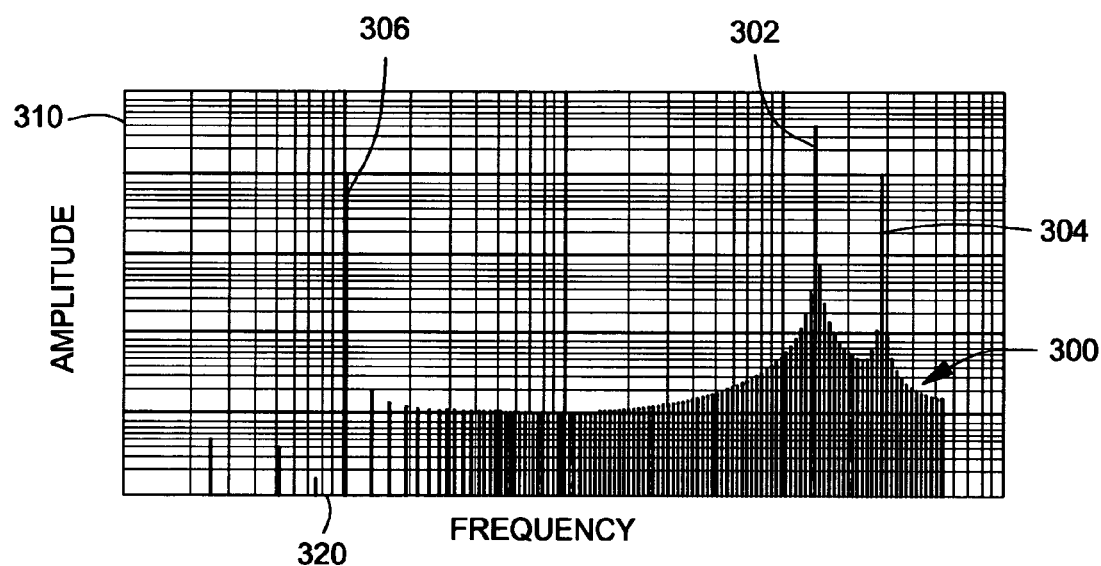
FIG. 3 is a graph of the frequency spectrum of the sheath voltage.

In operation, the two frequencies generated by the source 104 generally have about the same magnitude at the output of the source 104 and are selected such that each of the individual frequencies control a defined subset of plasma characteristics, such as high frequency plasma excitation, ion dissociation, the ion energy distribution function, and the like. The frequencies are also selected to be in close proximity to each other to allow for common matching through the matching circuit 106, as discussed further below. The difference between the two selected frequencies produces a wave packet effect that may be utilized to control a second subset of plasma characteristics, such as low frequency plasma excitation, sheath voltage modulation, and the like. This wave packet effect is illustrated in FIGS. 2 and 3. Alternatively, the ratio between the magnitude of the two frequency signals generated by the source 104 may be varied in order to control the magnitude of the wave packet effect created by the difference between the two frequencies.

The plasma characteristics controlled by the dual frequencies and the wave packet effect created from their difference may overlap (i.e., some or all of the characteristics controlled, such as plasma excitation, the ion energy distribution function, sheath modulation, and the like, may be at least partially controlled by both the dual frequencies provided by the source 104 and by the resulting wave packet effect created by the difference between the two frequencies.) Furthermore, the same or other plasma characteristics or subsets of plasma characteristics may be controlled by additional RF signals coupled to the plasma. For example, a third subset of plasma characteristics may be controlled by an RF signal provided by another RF source coupled to another electrode disposed in the chamber, as discussed with reference to FIG. 6, below.

FIG. 2 depicts the magnitude 210 of the Fourier components for the input waveform incident on the powered electrode 108 of the plasma chamber 102 as a function of frequency 220, and FIG. 3 depicts a frequency analysis of the sheath voltage waveform 300, showing the amplitude 310 of the resulting frequency components in the sheath as a function of frequency 320. As can be seen in FIG. 2, the frequency spectrum of the input waveform 200 includes two expected peaks 202, 204, corresponding to frequency 1 and frequency 2 being generated by the source 104. However, as can be seen in FIG. 3, a low frequency term (peak 306) is generated in the sheath in addition to the primary drive frequencies (peaks 302 and 304) from the source 104 and their expected harmonics. The sheath has a non-linear characteristic curve that affects the RF signals in the same manner as an RF mixer diode affects input RF signals, i.e., an inner modulation frequency component is formed that equals the difference between the two input frequencies. As such, the low frequency term (peak 306) is equal to the difference between the two frequencies generated by the source 104.

The maximum difference in drive frequencies generated by source 104 is determined by the characteristics of the matching circuit 106. Particularly, the resonant bandwidth of the matching circuit 106 is centered between the drive frequencies. The matching circuit 106 must have a Q that defines a bandwidth that efficiently couples both frequencies to the electrode 108 and the plasma. As long as the two drive frequencies fall substantially within the bandwidth of the matching circuit, the RF infrastructure is capable of supporting the two separate frequencies. Frequency differences on the order of the low frequency range typically employed for such process enhancement are available with current match technology.

Figures 4A, 4B:
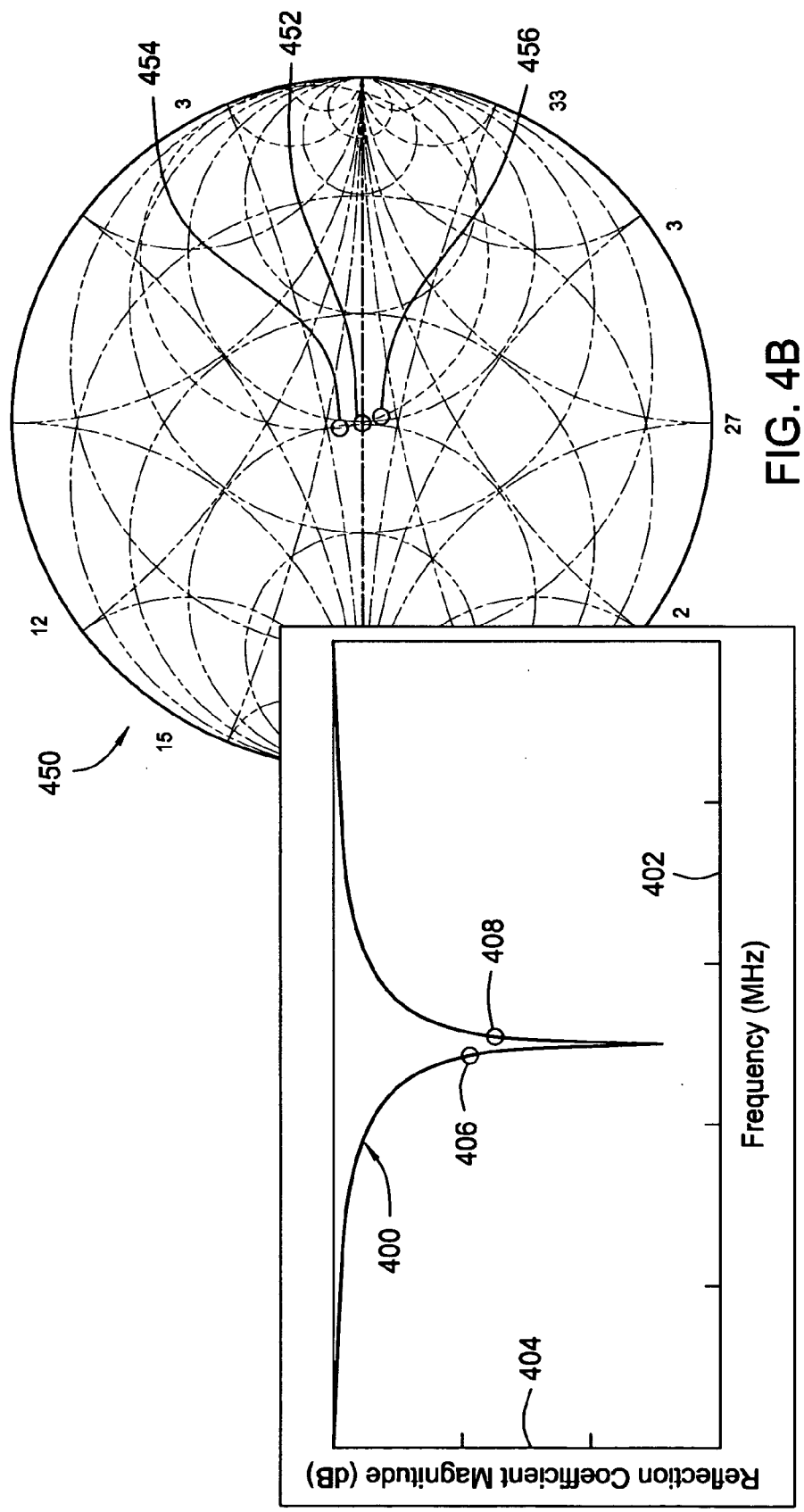
FIG. 4A is a graph of reflection coefficient magnitude versus frequency.
FIG. 4B is a Smith chart for the match element model.

FIG. 4A shows a plot 400 of the reflection coefficient in terms of magnitude for a typical L-type match and depicts the frequency in MHz along an axis 402 versus a reflection coefficient magnitude in decibels along an axis 404. The frequencies selected should be such that the reflection coefficient magnitude is small and substantially equal, as depicted by dots 406 and 408, for frequencies 1 and 2 generated by the source 104.

FIG. 4B shows the location of the frequencies in real/imaginary space for a typical L-type match. The exemplary Smith chart 450 depicted in FIG. 4B denotes a 50Ω load such as is generally present in standard RF power sources. The frequencies should be selected such that they fall as close to the center 452 of the Smith chart 450 as possible, so as to provide reasonably low reflected power, as depicted by the exemplary frequencies 454, 456 in FIG. 4B.

For example, to excite a plasma at 60 MHz and 2 MHz, two separate power sources and matches for these frequencies would normally be required in a standard plasma enhanced semiconductor processing chamber. However, in the current invention, two selected frequencies are centered around the high frequency value, i.e., the average of the two frequencies will be the high frequency component, and the two frequencies will be differentiated by a span equal to the desired lower frequency. In the present example, frequencies at 59 MHz and 61 MHz would be fed from a common source 104 through a common matching circuit 106, thus applying both a plasma excitation (59 and 61 MHz signals) and a 2 MHz modulation signal across the plasma sheath. This configuration reduces the RF infrastructure in current dual frequency technology from two sources and either two independent match elements or a single dual frequency match element to a single source and one single frequency match element, significantly reducing the cost of the system without sacrificing process benefit.

In another example, the two frequencies fed from the source 104 to the powered electrode 108 may be selected to control the same plasma characteristic as is controlled by the inner modulation frequency component (i.e., the difference between the two primary frequencies tunes the same plasma parameter as the primary frequencies generated by the source 104).

In one embodiment, the ion energy distribution function may be controlled by both the primary frequencies and the inner modulation frequency component. That is, the ion energy distribution function may be controlled by both the selection of the primary frequencies and the control of the difference between the primary frequencies. Specifically, the two frequencies fed from the source 104 to the electrode 108 cause the sheath to oscillate respectively at the two frequencies. In addition, the sheath oscillation also has a characteristic frequency at the difference between the two frequencies (i.e., due to the inner modulation frequency component).

If the plasma sheath oscillates faster than an ion can respond to, then the ion reacts to the time average, or DC, component of the sheath and the amount of deflection in trajectory that an ion experiences because of the change in potential of the sheath due to RF oscillation is equal to the inverse of the sheath frequency (e.g., the higher the sheath oscillation frequency, the less modulation of the velocity of an ion traversing the sheath). By selecting frequencies such that the reciprocal of the frequency differential is lower than the time it takes for an ion to traverse the sheath when it is accelerated from the plasma bulk, then the sheath oscillation at the frequency differential can add time variability to the final energy of the ion. Thus, the ion energy distribution function may be controlled by controlling oscillation frequencies in the sheath that straddle the ion transit time in the sheath (e.g., oscillation frequencies in the sheath are both greater than and less than the inverse of the ion transit time in the sheath).

In one embodiment, the primary frequencies may be selected to be greater than the inverse of the ion transit time. In addition, the difference between the primary frequencies may be selected to be less than the inverse of the ion transit time. Controlling both the primary frequencies and the difference between the primary frequencies allows control of the ion energy distribution function.

For example, in one embodiment, the source 104 may generate two signals having primary frequencies of about 13.56 and about 13.86 MHz to the electrode 108. This causes the plasma sheath to oscillate at 13.56 and 13.86 MHz, respectively. In addition, the sheath will have a characteristic oscillation at 300 KHz due to the inner modulation frequency component generated at the difference between the two primary frequencies.

Figure 7B:
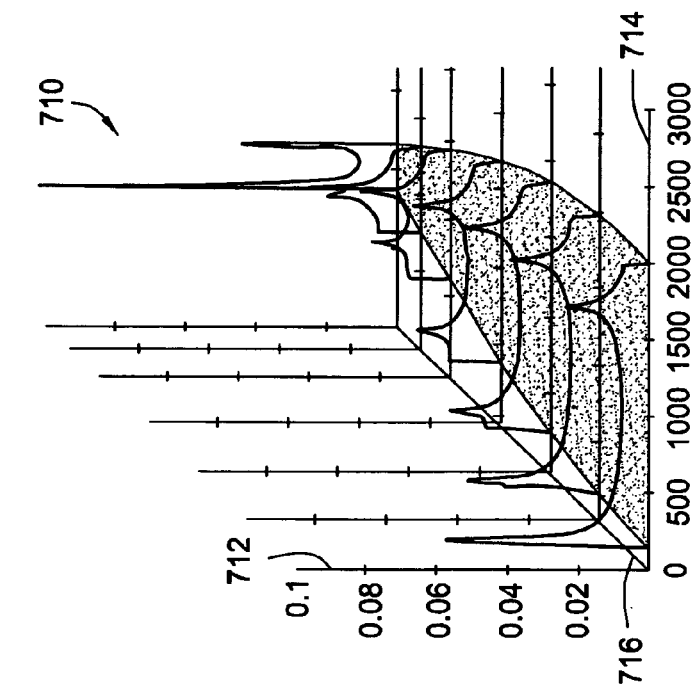
FIGS. 7A and B are graphs comparing the ion energy distribution of one embodiment of a process chamber having dual frequency source to another process chamber having separate frequency sources coupled to separate electrodes in the chamber.
Figure 7A:
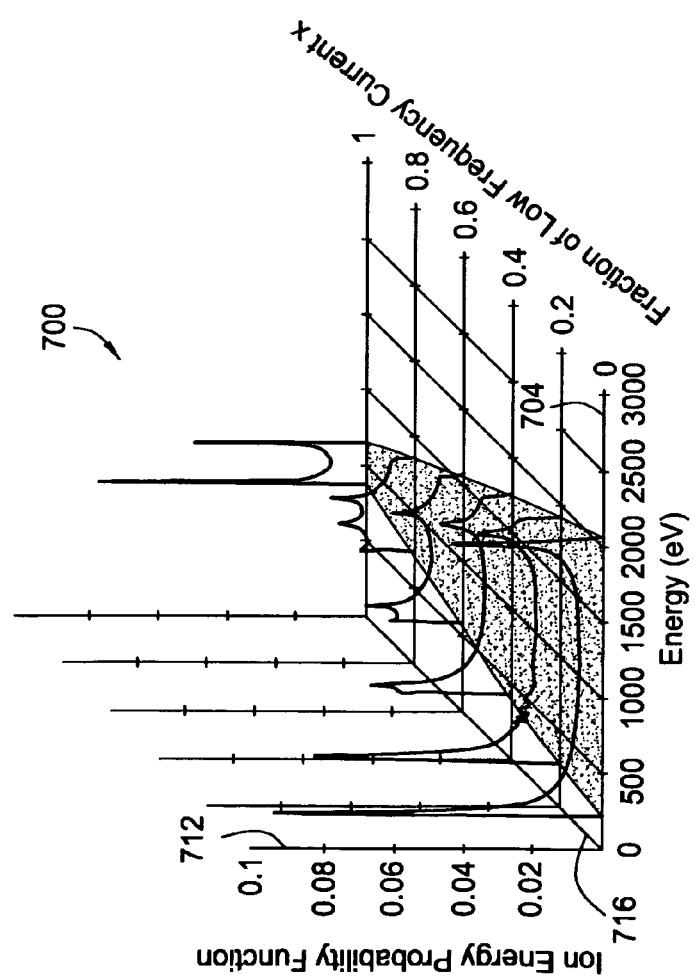

As can be seen by comparison between the graphs depicted in FIGS. 7A and 7B, the ion energy distribution function 700 (depicted in FIG. 7A) for a process chamber having a dual frequency source providing primary frequencies of about 13.56 and about 13.86 MHz, as described above, is very similar to the ion energy distribution function 710 (depicted in FIG. 7B) resulting from a process chamber having two separate RF sources. As such, the dual-frequency source configuration of the present invention advantageously allows for similar control of the ion energy distribution function as compared to chambers having separate RF sources coupled to top and bottom electrodes in the process chamber, thereby significantly reducing the complexity and hardware cost associated with the process chamber.

In addition, the relative magnitude of the primary frequencies and the inner modulation frequency component may further be utilized to control the ion energy distribution function. For example, the relative current or the relative power of the two primary frequencies may be selectively provided to control the magnitude of the inner modulation frequency component. Specifically, when the two primary frequencies are applied with the same current, the magnitude of the inner modulation frequency component will be maximized. Reducing the current of one of the two primary frequencies with respect to the other will reduce the magnitude of the inner modulation frequency component until, at zero current applied (i.e., no second frequency), the inner modulation frequency component disappears.

The relative magnitude of the inner modulation frequency component vis-à-vis the magnitude of the current or power of the primary frequencies adds further variability to the ion energy distribution and, therefore, allows control of the ion energy distribution function over a range of relative magnitudes.

Examples of plasma enhanced semiconductor processing chambers that may be adapted to benefit from the present invention include, but are not limited to, the Decoupled Plasma Source (DPS®, DPS® II), EMAX™, MXP®, and ENABLER™ processing chambers, all available from Applied Materials, Inc. of Santa Clara, Calif. The EMAX™ processing chamber is described in U.S. Pat. No. 6,113,731, issued Sep. 5, 2000 to Shan et al. The MXP® processing chamber is described in U.S. Pat. No. 5,534,108, issued Jul. 9, 1669 to Qian et al., and U.S. Pat. No. 5,674,321, issued Oct. 7, 1997 to Pu et al. The ENABLER™ processing chamber is described in U.S. Pat. No. 6,528,751, issued Mar. 4, 2003 to Hoffman et al. Each of these above-mentioned patents are hereby incorporated by reference in their entireties.

Figure 5:
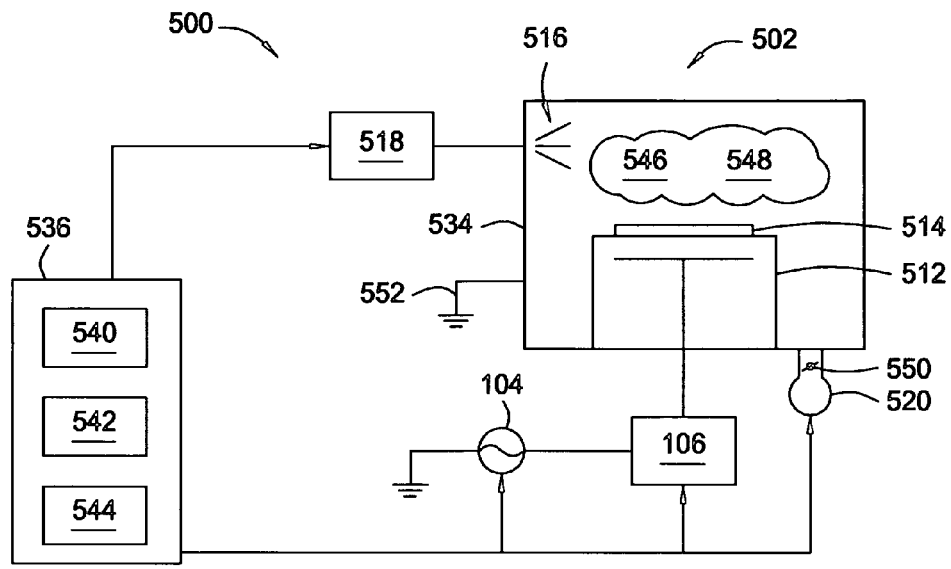
FIG. 5 is a simplified schematic of one embodiment of a processing chamber having a dual frequency RF source.

FIG. 5 depicts a schematic diagram of one illustrative embodiment of an etch reactor 500 suitable for use with the present invention. In one embodiment, the reactor 500 includes a process chamber 502 having a substrate support pedestal 512 within a conductive body (wall) 534, and a controller 536. The support pedestal 512 is coupled through the matching circuit 106 to the dual frequency RF power source 104. (The source 104 and the matching circuit 106 are described above with respect to FIG. 1.)

The controller 536 includes a central processing unit (CPU) 540, a memory 542, and support circuits 544 for the CPU 540 and facilitates control of the components of the process chamber 502 and, as such, of the etch process, as discussed below in further detail. The controller 536 may be one of any form of general-purpose computer processor that can be used in an industrial setting for controlling various chambers and sub-processors. The memory, or computer-readable medium, 542 of the CPU 540 may be one or more of readily available memory such as random access memory (RAM), read only memory (ROM), floppy disk, hard disk, or any other form of digital storage, local or remote. The support circuits 544 are coupled to the CPU 540 for supporting the processor in a conventional manner. These circuits include cache, power supplies, clock circuits, input/output circuitry and subsystems, and the like. The inventive method is generally stored in the memory 542 as a software routine. The software routine may also be stored and/or executed by a second CPU (not shown) that is remotely located from the hardware being controlled by the CPU 540.

In a basic etch operation, a substrate 514 is placed on the pedestal 512 and process gases are supplied from a gas panel 518 through entry ports 516 and form a gaseous mixture 546. The gaseous mixture 546 is ignited into a plasma 548 in the chamber 502 by applying power from the dual RF source 104 to the substrate support pedestal 512. The two frequencies generated by the source 104 are generally selected in the high frequency range in order to promote plasma excitation and ion dissociation. The two frequencies generated by the source 104 are further differentiated by a predetermined span equal to a particular low frequency desirable, for example, for modulating the plasma sheath.

Typically, the chamber wall 534 is coupled to an electrical ground 552. The pressure within the interior of the chamber 502 is controlled using a throttle valve 550 and a vacuum pump 520. The temperature of the wall 534 is controlled using liquid-containing conduits (not shown) that run through the wall 534.

Other forms of etch chambers may be used to practice the invention, including chambers with remote plasma sources, microwave plasma chambers, electron cyclotron resonance (ECR) plasma chambers, and the like. This technique is likewise not limited to etch but to any other plasma assisted process, including deposition, annealing, nitridation, implantation, and the like.

Figure 6:
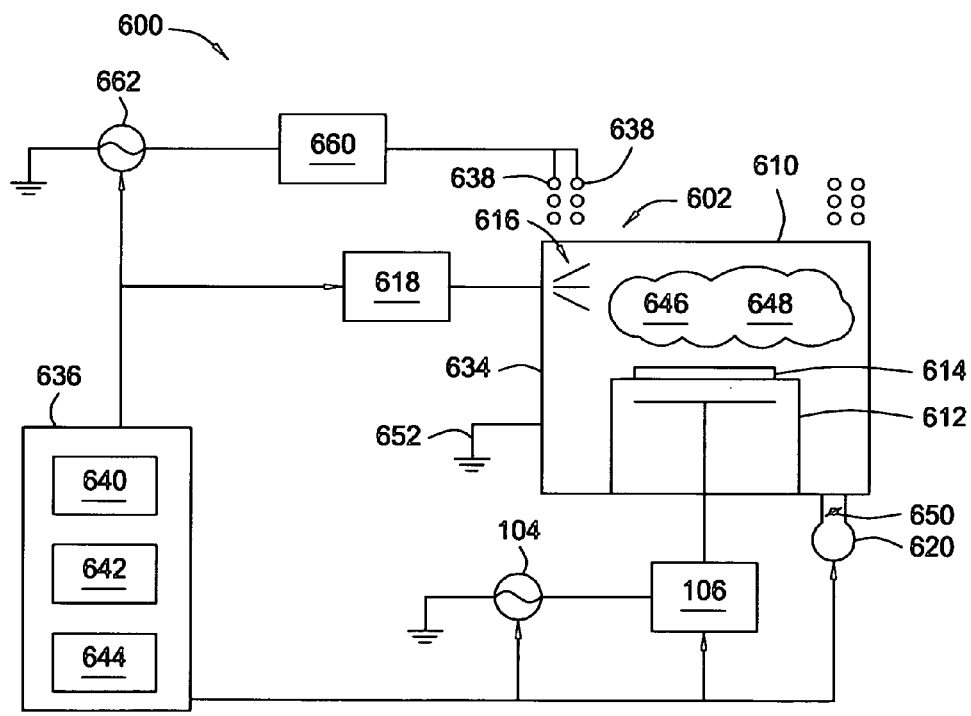
FIG. 6 is a simplified schematic of another embodiment of a processing chamber having a dual frequency RF source.

For example, FIG. 6 depicts a schematic diagram of another illustrative embodiment of an etch reactor 600 suitable for use with the present invention. In one embodiment, the reactor 600 includes a process chamber 602 having a substrate support pedestal 612 within a conductive body (wall) 634, and a controller 636. The controller 636 is similar to controller 536 described above with reference to FIG. 5. The support pedestal 612 is coupled through a matching circuit 106 to a dual frequency RF power source 104. (The source 104 and matching circuit 106 are described above with respect to FIG. 1.) The chamber 602 further includes a dielectric ceiling 610 with at least one inductive coil 638 disposed thereabove (two coils 638 are depicted in the embodiment of FIG. 6). The inductive coils 638 are coupled to a second power source 662 through a second match element 660. The source 662 is generally a single RF generator capable of producing up to 3000 W at a tunable frequency in a range of from about 50 kHz to about 13.56 MHz. The frequency range given for the source 662 is the range generally used in processing chambers having an inductively coupled top source. Other ranges may be appropriate and may be used with the present invention in other types of processing chambers. For example, in a chamber with a capacitively coupled top source, the source generally produces signals with frequencies as high as 200 MHz. Alternatively, microwave sources may produce frequencies as high as 5 GHz.

In a basic etch operation, a substrate 614 is placed on the pedestal 612 and process gases are supplied from a gas panel 618 through entry ports 616 and form a gaseous mixture 646. The gaseous mixture 646 is ignited into a plasma 648 in the chamber 602 by applying power from the source 662 to the inductive coils 638 and by applying power from the dual RF source 104 to the substrate support pedestal 612. The two frequencies generated by the source 104 are generally selected in the high frequency range in order to promote plasma excitation and ion dissociation. However, the power may not be high enough to accomplish this and the source 104 may be utilized mainly to bias the substrate 614. The two frequencies generated by the source 104 are further differentiated by a predetermined span equal to a particular low frequency desirable, for example, for modulating the plasma sheath. The utilization of the dual frequency RF source 104 in combination with the source 662 provides more process control variables to control processing of the semiconductor substrate 614 in the chamber 602.

Typically, the chamber wall 634 is coupled to an electrical ground 652. The pressure within the interior of the chamber 602 is controlled using a throttle valve 650 and a vacuum pump 620. The temperature of the wall 634 is controlled using liquid-containing conduits (not shown) that run through the wall 634.

While the foregoing is directed to the illustrative embodiment of the present invention, other and further embodiments of the invention may be devised without departing from the basic scope thereof.

The invention claimed is:

1. A method for controlling a plasma in a plasma enhanced semiconductor substrate processing chamber, comprising:
   supplying a first RF signal to a first electrode within the processing chamber at a first frequency selected to cause plasma sheath oscillation at the first frequency;
   supplying a second RF signal to the first electrode at a second frequency selected to cause plasma sheath oscillation at the second frequency, wherein the second frequency is different from the first frequency by a differential equal to a desired frequency selected to cause plasma sheath oscillation at the desired frequency, wherein the frequency differential ranges from about 100 KHz to about 2 MHz.

2. The method of claim 1, wherein the reciprocal of the desired frequency is less than the time it takes for an ion to traverse a sheath of the plasma when accelerated from a bulk of the plasma.

3. The method of claim 1, wherein the first and the second frequency are selected to cause a response much faster than a transit time for an ion to traverse a sheath of the plasma when accelerated from a bulk of the plasma.

4. The method of claim 3, wherein the desired frequency is selected to control an ion energy distribution function of the plasma.

5. The method of claim 1, wherein the first and second RF signals are coupled to the processing chamber through a common matching circuit having a single output to the electrode in the processing chamber.

6. The method of claim 1, wherein the first and second RF signals have an average frequency of about 13.5 MHz.

7. The method of claim 6, wherein the frequency differential ranges from about 100 KHz to about 1 MHz.

8. The method of claim 1, wherein the first and second RF signals have an average frequency of about 60 MHz.

9. The method of claim 8, wherein the frequency differential ranges from about 1 MHz to about 2 MHz.

10. The method of claim 1, wherein the first frequency is about 13.56 MHz and the second frequency is about 13.86 MHz.

11. The method of claim 1, further comprising:
    coupling a third RF signal to a gas to form the plasma.

12. The method of claim 1, wherein the first electrode is disposed within a substrate support pedestal.

13. The method of claim 1, wherein the first and the second frequencies are supplied by a single RF power supply capable of providing two separate frequencies.

14. The method of claim 1, wherein the first and the second frequencies are supplied at a frequency and power level sufficient to cause formation of the plasma.

15. A method for controlling a plasma in a plasma enhanced semiconductor substrate processing chamber, comprising:
    supplying, to a first electrode within the processing chamber, a first and a second RF signal at a first and a second frequency, respectively, selected to cause a response much faster than a transit time for an ion to traverse a sheath of the plasma when accelerated from a bulk of the plasma; and
    controlling a frequency differential between the first and the second frequencies equal to a desired frequency selected to control an ion energy distribution within the plasma, wherein the frequency differential ranges from about 100 KHz to about 2 MHz.

16. The method of claim 15, wherein the reciprocal of the desired frequency is less than the time it takes for an ion to traverse a sheath of the plasma when accelerated from a bulk of the plasma.

17. The method of claim 15, wherein the first and the second frequency generate a monoenergetic ion energy distribution within the plasma.

18. The method of claim 17, wherein increasing the frequency differential broadens the ion energy distribution within the plasma.

19. The method of claim 15, wherein the first and the second frequencies are supplied at a frequency and power level sufficient to cause formation of the plasma.

* * * * *